United States Patent [19]
Melfi et al.

[11] Patent Number: 5,943,245
[45] Date of Patent: Aug. 24, 1999

[54] MOTOR APPLICATION AND SELECTION METHOD AND APPARATUS

[75] Inventors: Michael J. Melfi, Euclid, Ohio; John R. Early; Wesley L. Haynes, both of Gainsville, Ga.

[73] Assignee: Reliance Electric Industrial Company, Cleveland, Ohio

[21] Appl. No.: 08/887,070

[22] Filed: Jul. 2, 1997

[51] Int. Cl.$^6$ .............................. G06F 17/50; G06G 7/48

[52] U.S. Cl. .......................... 364/512; 364/401; 364/402; 364/403; 364/468; 364/424.24; 364/512; 395/919

[58] Field of Search ............................... 364/468, 424.24, 364/512, 401, 402, 403; 395/919

[56] References Cited

U.S. PATENT DOCUMENTS

| | | | |
|---|---|---|---|
| 5,504,687 | 4/1996 | Wolf | 364/468 |
| 5,539,652 | 7/1996 | Tegethoff | 364/490 |

OTHER PUBLICATIONS

Mahmoud, et al, "An expert System for Evaluation and Selection of Floor Finishing Materials" published in Expert Systems With Applications, vol. 10, No. 2, pp. 281–303, 1996.

*Primary Examiner*—Kevin J. Teska
*Assistant Examiner*—Lonnie A. Knox
*Attorney, Agent, or Firm*—Michael E. Hudzinski; John M. Miller; John J. Horn

[57] ABSTRACT

Variable speed AC motors are selected in accordance with user defined characteristics. A reference database containing information on a selected variety of frame/modules is modified in accordance with selected input data. The complexity of selecting an appropriate sized frame/module is simplified by utilizing key information about the motor electromagnetic characteristics as well as how they will vary due to operation at some user/application-defined operating conditions. The user/application-defined operating conditions are multi-dimensional, and include cooling/enclosure variations, ambient temperature, altitude, service factor, minimum, nominal, and maximum speeds (and corresponding continuous and momentary load torques at each of these speeds). This allows a person without intimate knowledge of motor characteristics to choose an optimal combination of motor and corresponding variable voltage, variable frequency supply for a particular application.

19 Claims, 13 Drawing Sheets

FIG. 2

| ENCLOSURE 20a | SORT ORDER 20b | FRAME SIZE 20c | SPEED 20d | HP 20e | CON POWER 20f | OVL BBS 20g | OVL ABS 20h | CALC FACTOR 20i | CALC HP 20j | IEC FRAME 20k |
|---|---|---|---|---|---|---|---|---|---|---|
| DPFV | 005 | L2153 | 0 | 0 | | | | | 0 | DL1303 |
| DPFV | 005 | L2153 | 85 | 1.307692 | 1.25 | 1.5 | 1.1 | 1 | 1.307692 | DL1303 |
| DPFV | 005 | L2153 | 850 | 13.07692 | 1.25 | 1.5 | 1.1 | 1 | 13.07692 | DL1303 |
| DPFV | 005 | L2153 | 1750 | 26.15385 | 1.25 | 1.5 | 1.1 | 1 | 26.15385 | DL1303 |
| DPFV | 005 | L2153 | 2300 | 30.73077 | 1.25 | 1.5 | 1.1 | 1 | 30.73077 | DL1303 |
| DPFV | 005 | L2153 | 3000 | 34.65385 | 1.23 | 1.5 | 1.1 | 1 | 34.65385 | DL1303 |
| DPFV | 005 | L2153 | 4200 | 40.53846 | 1.15 | 1.35 | 1.1 | 1 | 40.53846 | DL1303 |
| DPFV | 005 | L2153 | 6000 | 40.53846 | 1.08 | 1.25 | 1.1 | 1 | 40.53846 | DL1303 |
| TENV | 030 | L2869 | 0 | 0 | | | | | | |
| TENV | 030 | L2869 | 58 | 0.7129821693 | 1.9 | 2.25 | | | | |
| TENV | 030 | L2869 | 580 | 7.129821693 | 1.9 | 2.25 | | | | |
| TENV | 030 | L2869 | 1185 | 13.04397204 | 1.9 | 2.25 | | | | |
| TENV | 030 | L2869 | 1785 | 17.62428599 | 2 | 2.5 | | | | |
| TENV | 030 | L2869 | 2380 | 19.99758187 | 2 | 2.5 | | | | |
| TENV | 030 | L2869 | 3125 | 21.10698025 | 1.85 | 2.5 | | | | |
| TENV | 030 | L2869 | 4020 | 21.35326710 | 1.2 | 2.25 | | | | |
| | | | | | 1.05 | 1.75 | | | | |
| TEBC | 015 | L2162 | 850 | 12.56 | 2 | 2.5 | | | | |
| TEBC | 015 | L2162 | 1750 | 25.12 | 2 | 2.5 | | | | |
| TEBC | 015 | L2162 | 2300 | 30 | 1.83 | 2.5 | | | | |
| TEBC | 015 | L2162 | 3000 | 33.5 | 1.7 | 2.25 | | | | |
| TEBC | 015 | L2162 | 4200 | 37 | 1.44 | 2 | | | | |
| TEBC | 015 | L2162 | 6000 | 40 | 1.16 | 1.6 | | | | |

MOTOR APPLICATION AND SELECTION METHOD AND APPARATUS

BACKGROUND OF THE INVENTION

The present invention relates to motor selection for customer specified applications. The invention finds particular application in a software implemented motor selection device and method allowing for selection of modified and custom built motors which take into account effects user defined inputted operating requirements have on motor characteristics, and will be described with particular reference thereto.

Traditionally, motor selection is accomplished through the use of a printed catalog which lists a range of motors along with their basic operating ranges. A user reviews the catalog and selects a motor having operational capabilities which most closely match the requirements.

Recently, software programs have been developed that allow a user to make a selection from a software implemented catalog. Motors are selected in a similar manner to that of the hard copy catalog, where desired operational capabilities such as horsepower or operation speed are input, and the software works to select a motor closest to the desired requirements. In such a system all data for the motor design exists in a pre-existing database.

When the user wishes to select a motor to operate under specific conditions or for a specific application, which may not be precisely described in the catalog, the software will either not be able to locate that motor or is required to select a less than optimal product. Further, existing catalog type motor selection provides no procedure which adjusts selection due to the inter-relationships between different operational requirements or conditions.

Therefore, existing catalog selection programs have significant shortcomings. To address these shortcomings, it is necessary to take into account the effects operating requirements and environment will have on the operation of the motor. Presently, obtaining proper motor configuration, especially for modified or customized motors, is accomplished manually, i.e. a person reviews the operating requirements, compares these to charts showing operating characteristics of specific motors and a motor sized to address the need is selected. For such situations, it is necessary for the person configuring the motor to have a complete understanding of motor characteristics and how real world applications will affect operation. Such a person needs to be highly trained and have a detailed understanding of motors. When a customer has such requirements the salesperson dealing with the customer may not have the required expertise, and it becomes necessary to bring an engineer or other trained person into the selection process.

Once the engineer has obtained the information regarding the operating requirements and environment of operation, a variety of charts, graphs and calculations are used to derive the appropriate configuration. This is an involved process which needs to take into consideration numerous options. For example, in a particular application a customer may be willing to increase the module size of the motor in order to decrease the size of the inverter supplying the motor. Conversely, the customer may be willing to increase the inverter rating to maintain the motor at a particular size.

Therefore, the use of software based catalog systems is not effective since it does not provide a procedure to take into account external environmental consideration and operational requirements in assisting in the selection process. The alternative of manually determining an appropriate configuration is less than desirable, due to its complexity and requirement of using a highly skilled worker, who is thereby taken away from some other task. Additionally, it will take an extended time for the customer to receive his answer, i.e. the quote to the customer cannot be given in substantially "real time".

The present invention contemplates a new and improved motor configuration/selection device and method which automatically assists in motor configuration/selection, especially for specialized or customized motors, by taking into consideration the operating characteristics of the motor, as well as inter-relationships of environmental, operational, and user imposed limitations. The system is designed such that users having little understanding of motor construction can provide the desired inputs and receive an output for specialized or customized motor applications, thereby freeing the resources of a highly skilled engineer for other projects and providing answers to customer questions in a rapid substantially real time fashion.

SUMMARY OF THE INVENTION

In accordance with one aspect of the present invention, a device and method for motor selection and configuration is provided. A base program includes information concerning the operating characteristics of selected motor modules/frames in the form of a reference database. The reference database includes, for each selected module, data regarding the base speed, speed ranges, overloads across each speed range, above and below a base speed, maximum output power available and information directed to different enclosures/cooling methods. A user is prompted to input pertinent characteristic and condition information. Using selected input information, the reference database can be modified if necessary to reflect the capability of each module in accordance with the user-defined conditions. The input information is also examined to determine whether the information is outside accepted or normal conditions and/or outside a range of applicability of the database. When the input information is outside of normal conditions and outside a range of applicability for the database, a warning is issued and the user is able to modify the input data.

When the input information is outside of normal conditions for a selected module but within a range of applicability for the database, the operations to obtain a most economical motor module is undertaken. Once a module is found which meets the requirements for a load at a base speed, it is determined whether the requirements are met at maximum and minimum speed operating ranges. If all characteristics are met for all speeds in the speed range defined by a user, the selected module designation is displayed. When the module cannot handle all of the requested speeds/loads without any impact on variable voltage, variable frequency supply sizing, the user is provided with a choice of either the smallest module and its operating limitations or a next larger module along with the associated characteristics including associated variable voltage, variable frequency supply sizing.

One advantage of the present invention is that it can be used by a person having limited knowledge regarding motor characteristics allowing that person to provide a rapid response to a customer inquiry.

Another advantage of the present invention is that the motors selected and/or configured may be for specialized requirements.

Yet another advantage of the present invention is configuring motors meeting very specific requirements at a high efficiency rating.

Still further advantages will be apparent to those of ordinary skill in the art upon reading and understanding the following detailed description of the preferred embodiment.

BRIEF DESCRIPTION OF THE DRAWINGS

The invention may be embodied in various steps and arrangements of steps and various components and arrangements of components. The drawings are only for purposes of illustrating a preferred embodiment and are not to be construed as limiting the invention.

FIG. 2 illustrates a reference database according to the teachings of the subject invention;

FIG. 4 is a Basic Rating Info. screen illustrating the prompting areas for the input of user defined characteristics;

FIG. 5 is an Application Info. screen which includes the modification factors used in part whether the reference database is modified;

FIG. 6 is a Modifications screen providing additional information as to the operation requirements of a motor to be selected;

FIG. 7 is an Other Information screen which provides additional information for input by a user;

FIG. 10 illustrates the output of the program when the smallest frame size and the next larger frame size are selected;

FIG. 11 is a Dimension Sheet for a selected module/frame;

DETAILED DESCRIPTION OF THE PREFERRED EMBODIMENT

It will be appreciated that while the following discussion concentrates on variable speed AC induction motors, the present invention is equally applicable to other types of motors.

Variable speed AC induction motors are used in a wide variety of applications including converters of electrical power into mechanical power. These applications can require minimum, nominal, and maximum speeds, as well as corresponding continuous and momentary load torques required at each speed. The variable speed AC induction motor is operated from a variable voltage, variable frequency supply. This invention selects a motor module/frame size, based on application data entered by a user. It is also particularly useful for selecting the inverter size (KVA) for applications which require constant power speed ranges in excess of the inherent capability of a catalog rating. The present system will also display typical performance data and dimension sheets corresponding to frame/module returned by the calculation.

Choosing the correct "size" of a motor and knowing the corresponding performance attributes (kVA,Amps) which a particular application and motor selection will demand, is sufficiently complex to typically require an engineer with intimate knowledge of the motor design. The following discussion details a system which reduces this complexity by utilizing key information regarding motor electromagnetic characteristics, as well as how the characteristics vary at user/application-defined operating conditions. These user/application-defined operating conditions can be multi-dimensional, and include cooling/enclosure variations, ambient temperature, altitude, service factor, minimum, nominal and maximum speeds, and the corresponding continuous and momentary load torques at each of these speeds.

Figure 1:
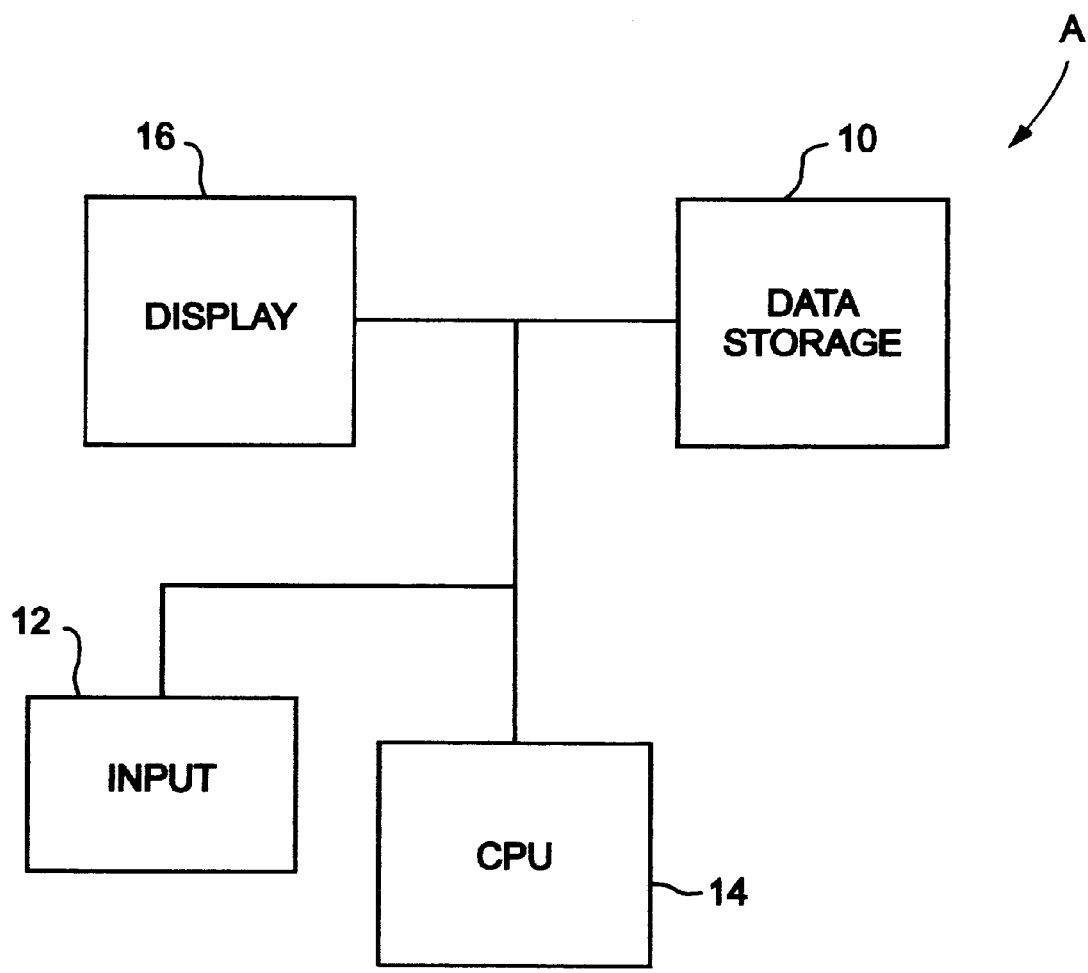
FIG. 1 is a block diagram of a data processing system used in connection with the present invention.

As illustrated in FIG. 1, the teachings of the present invention may be implemented in a data processing system such as a computer system A, including data storage 10, input device 12, central processing unit 14, and display 16. Each of these elements are interconnected in such a manner as known in the art including by direct connections, through a bus structure, through a modem configuration or other known means. Data storage 10 is configured to store a database containing data corresponding to characteristics of a set of motor modules, and instructions for the manipulation of this data. CPU 14 receives, processes and sends instructions in accordance with the subject invention. Input device 12, which may be a keyboard, mouse, voice activated interface or other such element, allows the user to interface with system A. Display 16 is used to display queries issued from the system and results of operation.

Initially, reference database B contains data regarding the operating characteristics of the motor modules (also referred to as frames) which comprise a defined universe of selectable motor modules. The contents of this database are stored in data storage 10 of FIG. 1. The data within reference database B includes a profile of the characteristics of each module across the dimensions of base speed ranges, overloads across each speed range (above and below a base speed), and different enclosures/cooling methods.

Particularly, reference database B of FIG. 2 includes a column ENCLOSURE 20a, which designates a particular type of enclosure, i.e. DPFV (Drip-proof, forced-ventilated), TEBC (Drip-proof, separately-ventilated), TEBC (Totally-enclosed, blower-cooled) and TENV (Totally-enclosed, non-ventilated). These enclosure designations signify certain characteristics, such as whether the enclosure includes a fan, external or internal air cooling or other features. The preceding descriptions are simply examples and a database can include other enclosure designations. Column SORT ORDER 20b, is a module designator which provides further identification of a module. This designation is a company specific and is not necessary to obtain the desired module according to the present invention. Column FRAME SIZE 20c, is an industry standard designation for the size of the frame/module in which the elements of the motor are configured.

Column, SPEED 20d designates the operation speeds which may be achieved by a motor within a particular frame size, as shown in FIG. 2, the frame size L2153 can be used to configure motors having speeds from 0–6000 RPM, in eight step increments. Similarly, column, horsepower (HP) 20e sets forth the horsepower rating for a particular frame size also in eight step increments, and in the above example is noted to have a range from 0–40.53846 HP, for frame L2153. It is noted that motors of any speed from 0–6000 RPM can be configured, by interpolation of the eight data points for the L2153 module. It is to be appreciated that the above can of course also be obtained for difference frame sizes.

Reference database B further includes a column, constant power rating factor (CON POWER) 20f, an overload below base speed rating column (OVL BBS), which defines 60 second overload torque capability 20g, an overload above base speed rating (OVL ABS) column 20h, which is the percentage of full load horsepower or kilowatts capability above the base speed, a calculation factor (CALC FACTOR) column 20i, a calculated horsepower (CALC HP) column 20j and a frame designation (IEC FRAME)column 20k, which is the European standard equivalent of FRAME SIZE 20c.

It is to be appreciated the information included in reference database B of FIG. 2 can be configured with additional information, or other speeds, horsepowers, etc. may be included. It is also to be appreciated the information may be in the form of other measurements such as kilowatts, metrics, etc.

The following discussion is to an embodiment implemented in a windows environment. It is to be understood, however, the invention can be implemented in other systems which allow for an interactive input/output between the user and the program.

Figure 3:
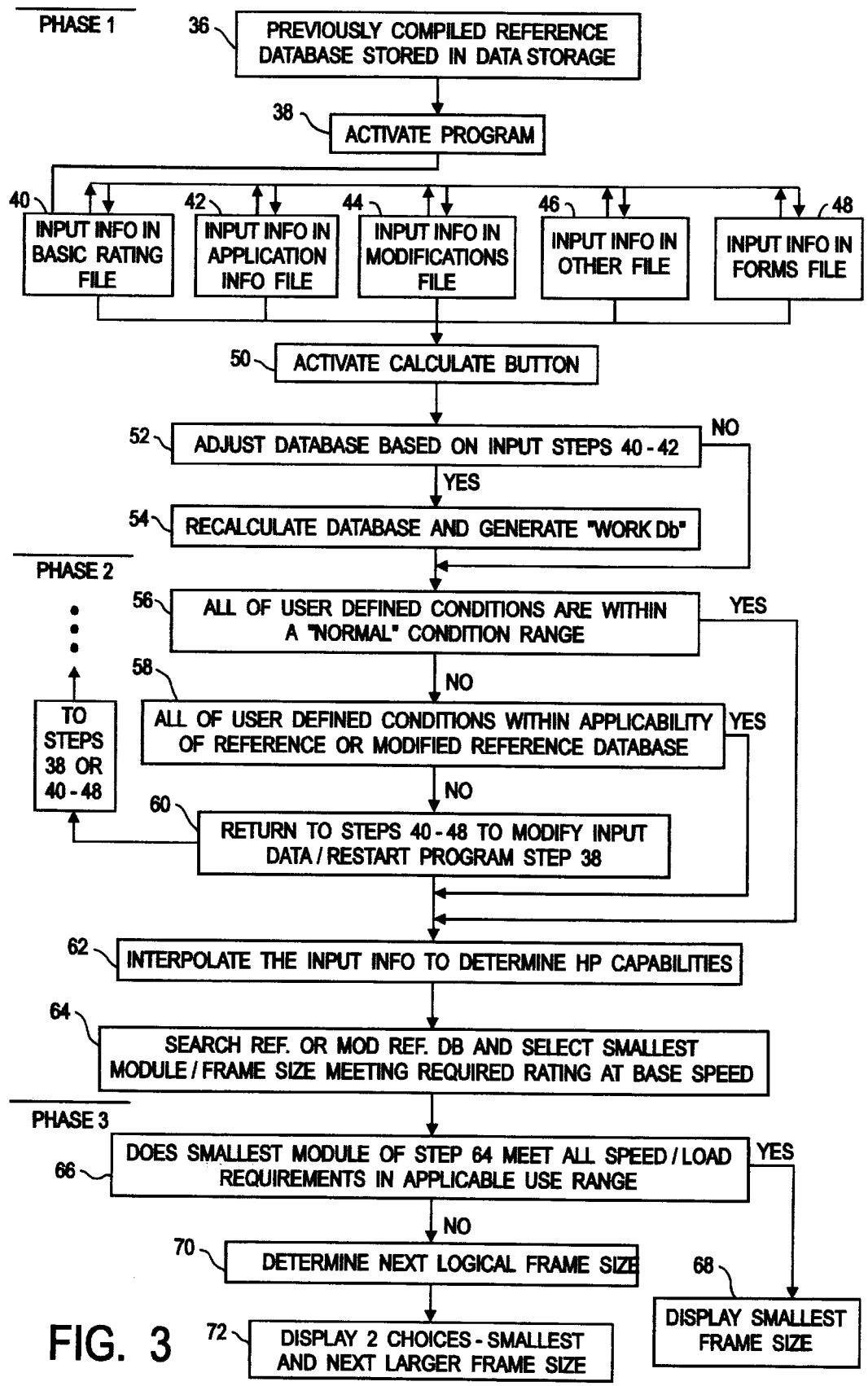
FIG. 3 is a flow chart showing the operational steps of the program according to the subject invention.
Figure 4:
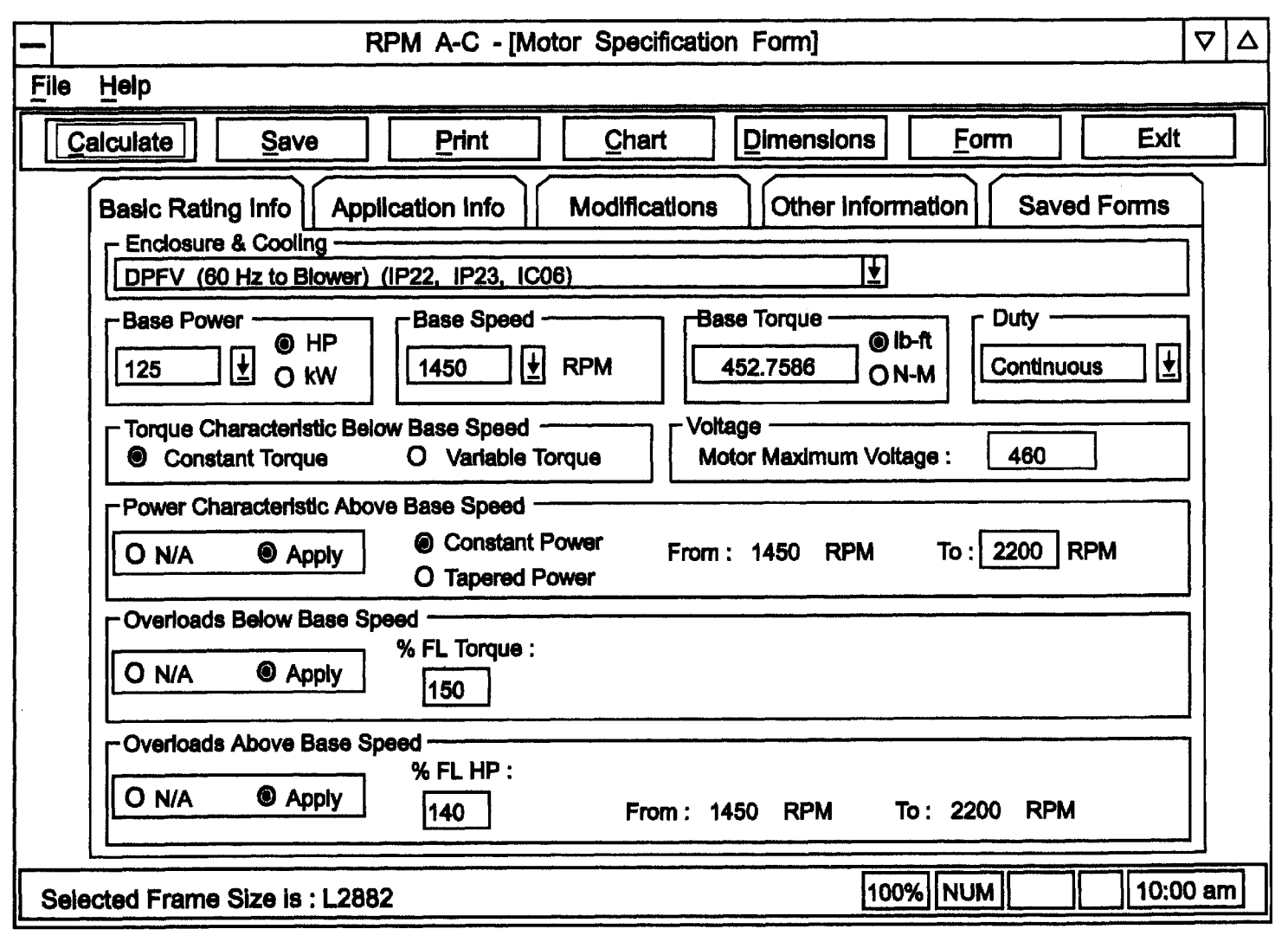

Turning attention to FIG. 3, operation of the present invention is described in three phases (Phases 1–3). Once the contents of reference database B are stored in data storage 10 (step 36) and the program is activated (step 38), a Basic Rating Info. file is displayed, step 40. The user is prompted for information via an input screen as shown in FIG. 4, to select block input areas such as Enclosure & Cooling. As with other blocks on this screen, a pull down menu is provided which supplies a range of selections. For Enclosure & Cooling, the pull down screen lists particular types of enclosures and cooling methods from which a selection is made. Also available on this screen are inputs for a desired Base Power, Base Speed, Base Torque, Duty Torque Characteristics Below Base Speed, Voltage, Power Characteristics Above Base Speed, Overloads Below Base Speed, and Overloads Above Base Speed. It is noted that if it is desired to input a value for Base Torque, such as for continuously rated torque applications, either the Base Power or Base Speed can be zeroed out (enter zero).

Figure 5:
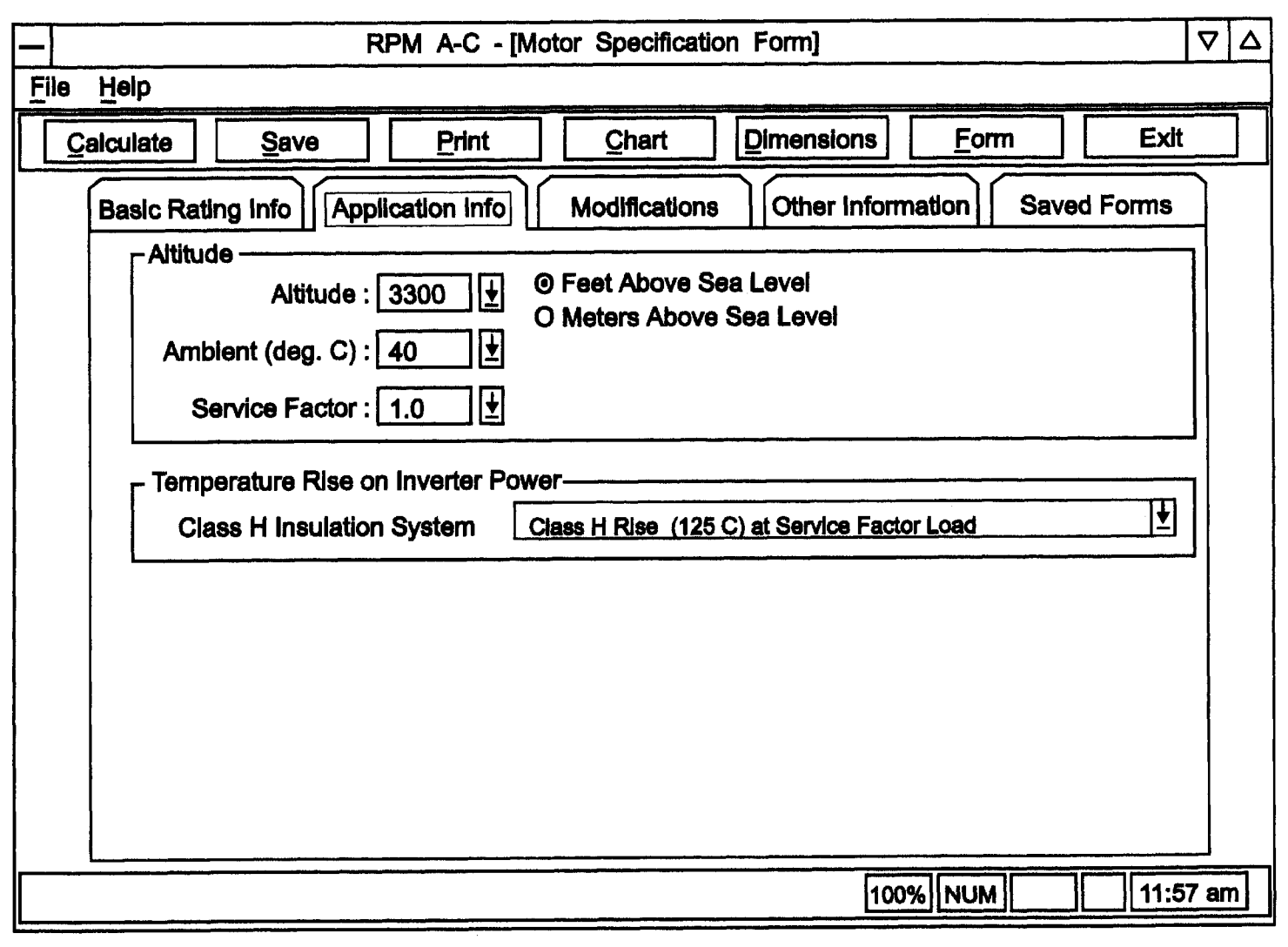

After the above information has been input, the user moves to step 42 and inputs or selects data in connection with the, Application Info. screen (FIG. 5).

The Application Info. file, FIG. 5, includes data input areas for the Altitude (i.e. altitude at which the motor will function), Ambient (i.e. ambient temperature around the motor), Service Factor (i.e. service factor of the particular motor), and Temperature Rise on Inverter Power (class of insulation of the motor; the standard insulation and rise for the motors represented in database B have Class H insulation, options which can also be selected are Class B or Class F NEMA and IEC temperature rises). It is to be noted that the motor selected will be capable of running continuously at service factor load. The continuous AMPS shown will be based on the Service Factor load; therefore, a controller may need to be oversized for continuous duty at the Service Factor load.

Figure 6:
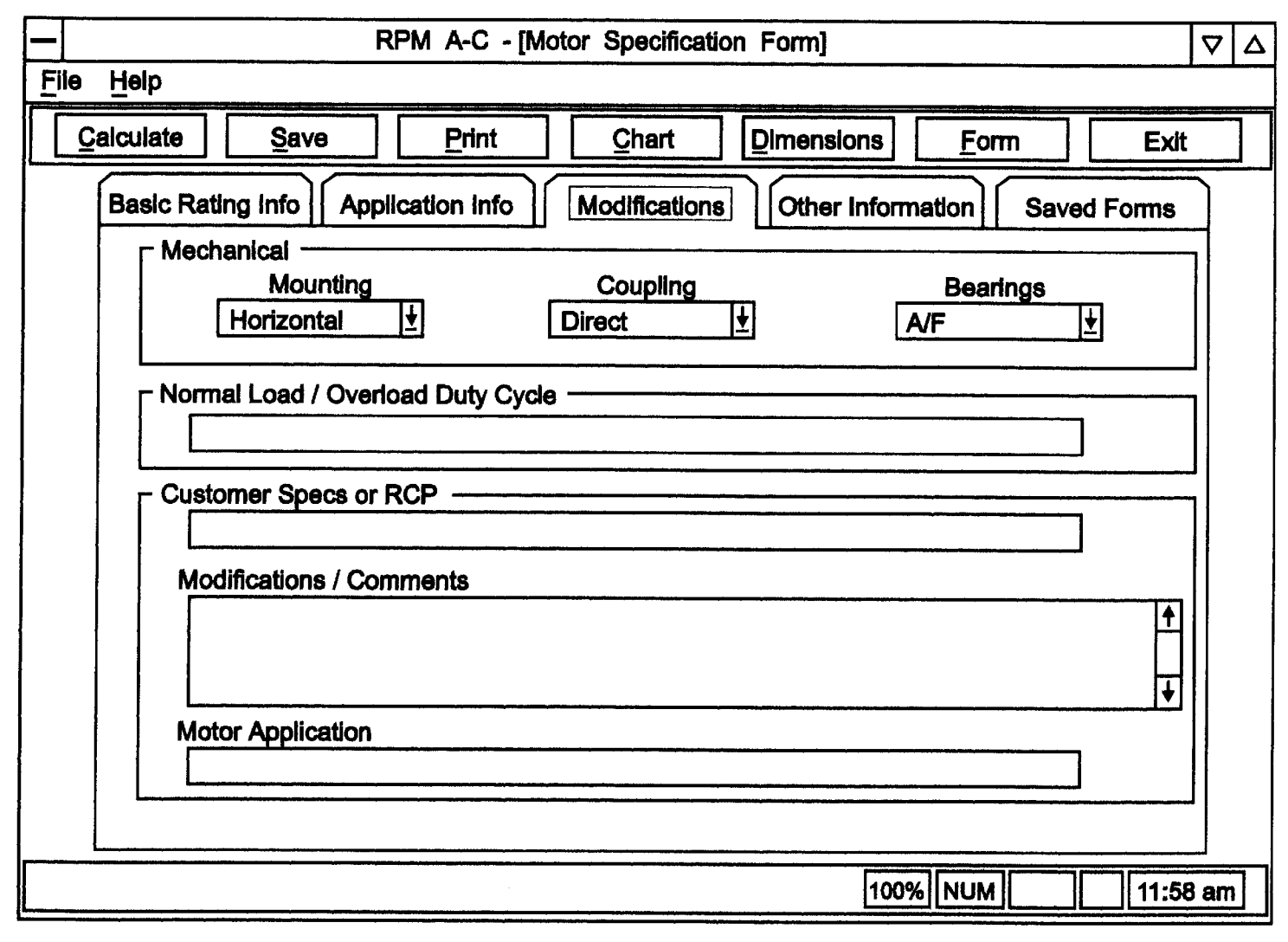
Figure 7:
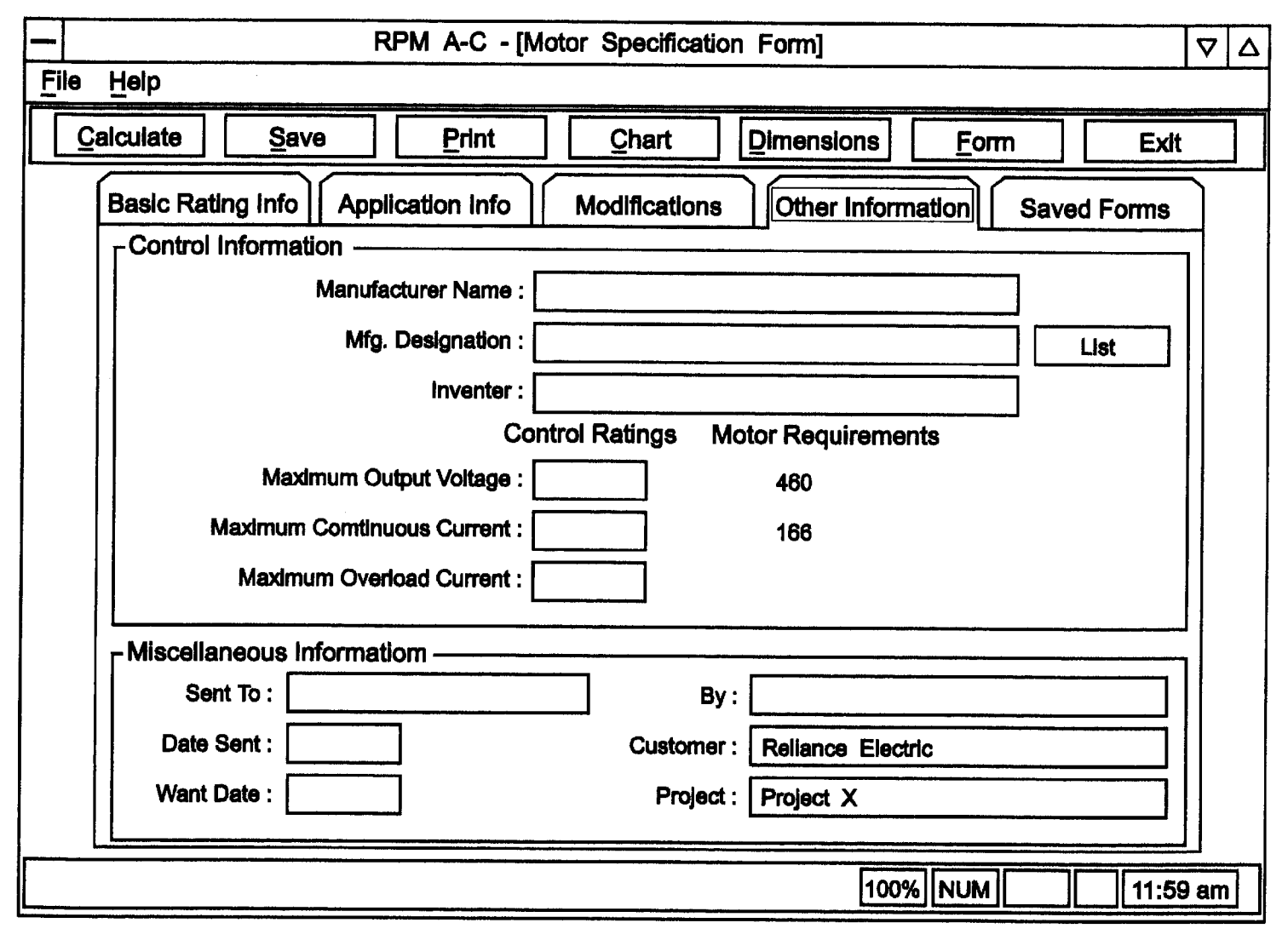
Figure 8:
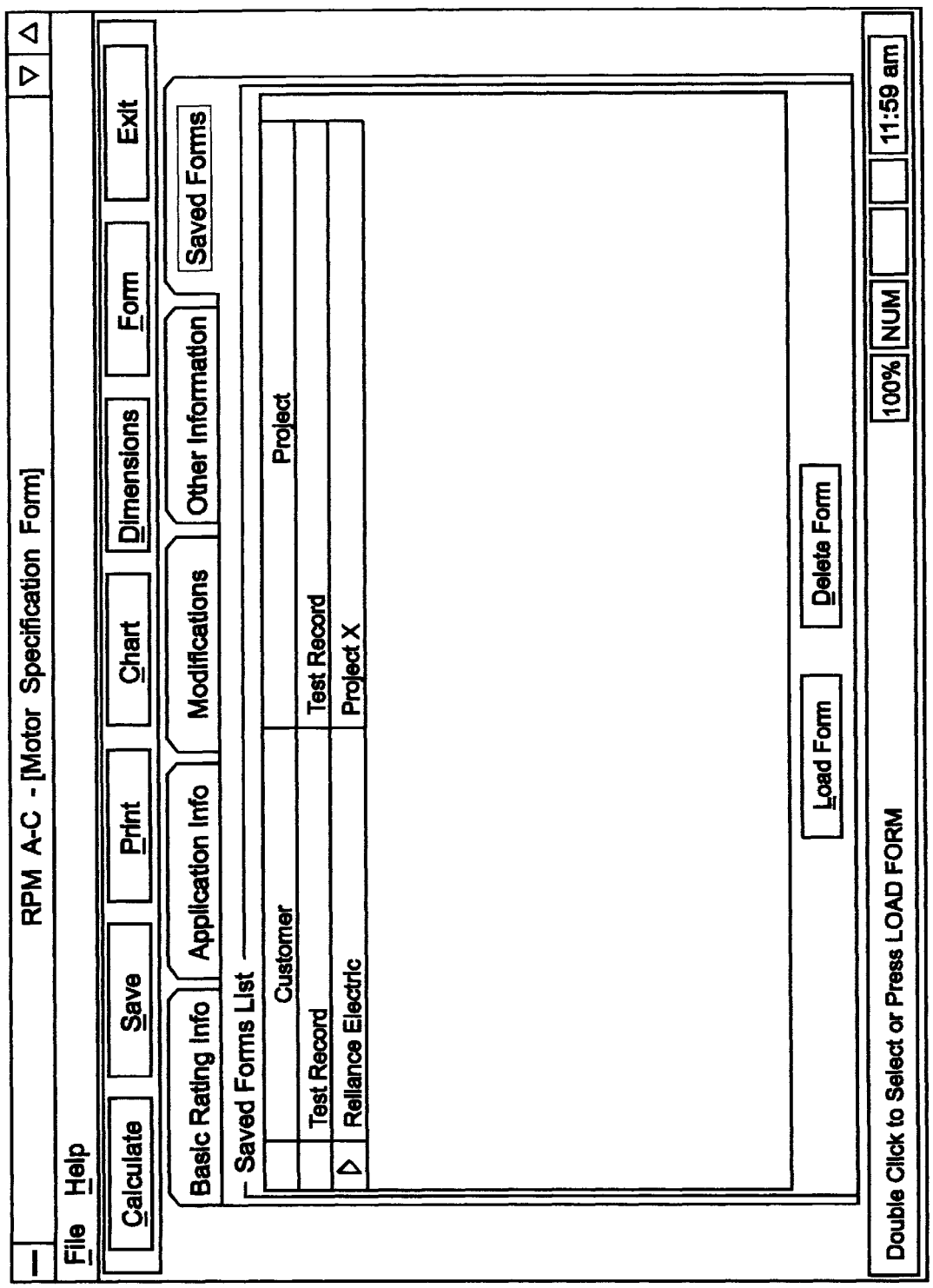
FIG. 8 is a Saved Forms screen which allows for maintaining a history of previously requested motors.

Once the appropriate information is inserted in the input areas of Basic Rating Info. screen (FIG. 4) and Application Info. screen (FIG. 5), the selection process for an appropriate frame size can be activated by selecting the Calculate button. However, it is also possible to input further information in steps 44–48 related to optional screens Modifications (FIG. 6), Other Information (FIG. 7), and Saved Forms (FIG. 8).

The Modifications screen (FIG. 6) includes additional information as to the mounting (i.e. horizontal, vertical, flanged, vertical flanged, horizontal flanged, or special), coupling (direct or belted), and the type of bearings used in the motor (A/F or sleeve). Information as to the normal load/overload duty cycle, customer specs or RCP, as well as comments as to modifications or motor applications may also be entered.

The Other Information screen (FIG. 7) includes control information, such as manufacture name, manufacture designation and the inverter being used. Further information entered on this screen includes the maximum output voltage, maximum continuous current, and maximum overload current, as well as certain miscellaneous information.

Lastly, the Saved Forms screen (FIG. 8) allows a user to retrieve a completed motor selection form, with its associated performance data and dimension sheets.

It is to be appreciated that in the present application, the term "base speed" refers to the speed at which the application goes from constant torque to constant power (or the highest speed of the constant torque range, or the lowest speed of the constant power range, as applicable). This will often correspond to the speed at which the motor reaches full voltage, as long as the constant power speed range is fairly small. However, if the constant power speed range is fairly large, the present program will allow the motor to reach full voltage at a speed higher than the "Base Speed" defined by the application requirements, in order to offer a smaller motor frame size. Thus, the term "Base Speed" is used in a slightly different manner then common usage.

Returning attention to FIG. 3, once the desired information has been input in steps 40–48 and a request for calculation is made by activating the Calculate button (step 50), it is then determined, based on the data input in steps 40–42, as to whether reference database B is to be modified (step 52). If the answer in step 52 is yes, a modified reference database is generated (step 54). This modification of reference database B takes place prior to the database being used to obtain the appropriate module/frame size. If no modification is needed, the program skips step 54.

Figure 9:
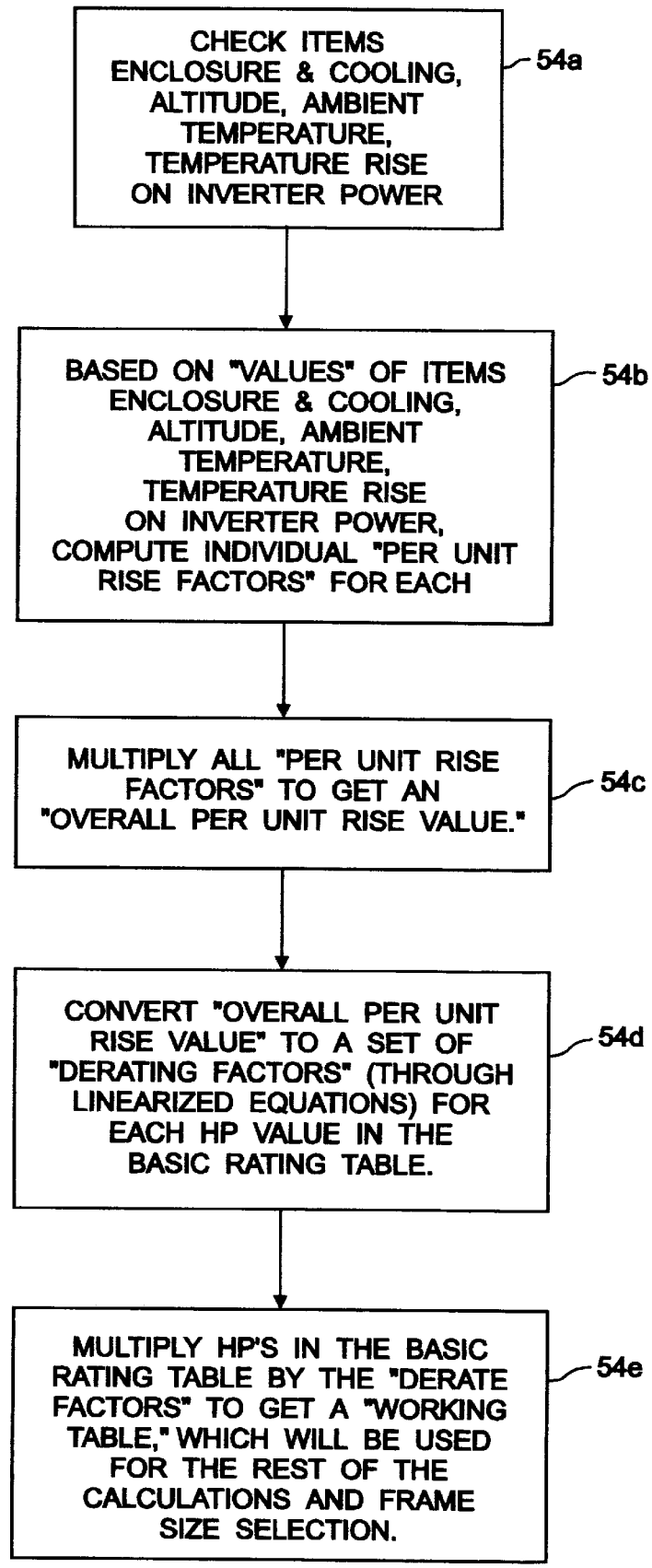
FIG. 9 is a flow chart for determining whether a reference database is to be customized/modified in accordance with the input values of the modification factors.

A more detailed review of the operation of reference database modification step 54 is illustrated in FIG. 9. Initially, in step 54a the program checks the values of modification items, (Enclosure & Cooling, Altitude, Ambient Temperature and Temperature Rise on Inverter Power) (MODIFICATION ITEMS). In step 54b, based on the values of input data for the MODIFICATION ITEMS, individual "per unit rise factors" are computed for each element. Thereafter in step 54c all the per unit rise factors are multiplied together to obtain an "overall per unit rise value". Next, in step 54d the overall per unit rise value is converted to a set of "derating factors" (through linearized equations) for each HP value in reference database B. Using this value, the program, in step 54e multiplies the HPs in reference database B by the derated factors to obtain a "working table", i.e. the modified reference database which will be used for the rest of the calculations and frame size selection.

Through steps 54a–54e, and depending on the values of the MODIFICATION ITEMS, a "run time" customization is performed on reference database B. It is to be noted that this not a permanent modification of reference database B, but rather is a modification specifically generated and stored for the particular requirements input by the user in steps 40–42 of FIG. 3.

The customization of reference database B amounts to a "multiplying factor" which reduces the HP values in the database. The "factor" is not a single value, but rather is a set of values which may vary with the frame size and type of enclosure.

Particular examples for obtaining the per unit rise factors, overall per unit rise value and the multiplying/derate factors include:

| FOR MODIFICATION ITEM (ENCLOSURE & COOLING) | |
|---|---|
| value | per unit rise factor |
| DPSV (IP22,IC17) | 1.0 |
| DPFV (60 Hz power to blower) (IP22,IC06) (this is default) | 1.0 |
| DPFV (50 Hz power to blower) (IP22,IC06) | see table A below |
| TEBC (60 Hz power to blower) (IP44,IC416) | 1.0 |
| TEBC (50 Hz power to blower) (IP44,IC416) | see table B below |

TABLE A

| Frame Size | per unit rise factor |
|---|---|
| L210,L250,L280,L320 | 1.0 |
| L360 | 0.9346 |
| L400 | 0.8621 |

TABLE B

| Frame Size | per unit rise factor |
|---|---|
| L210 | 0.909 |
| L250,L280,L320 | 0.9524 |
| L360,L400 | 1.0 |

FOR MODIFICATION ITEM (ALTITUDE)

If altitude<3330 ft, per unit rise factor=1.0 If altitude>3330 ft, per unit rise factor per equation below $$\text{per unit rise factor} = 1 - \left[ \frac{\text{altitude} - 3300}{33000} \right]$$

FOR MODIFICATION ITEM (AMBIENT)

If ambient<40° C., per unit rise factor=1.0 If ambient>40° C., per unit rise factor per equation below per unit rise factor=(1.33=0.00825×ambient)

FOR MODIFICATION ITEM (TEMP RISE)

| value | per unit rise factor |
|---|---|
| Class H Insulation System - Class H rise (125° C.) at Service Factor Load (default) | 1.0 |
| Class H Insulation System - Class R rise (100° C.) at Service Factor Load | 0.8 |
| Class H Insulation System - Class B rise (80°) at Service Factor Load | 0.64 |

The per unit rise factors from the modification items need to then be multiplied together, giving the overall per unit rise factor. Since the per unit rise factor from Modification Item (Enclosure & Cooling) is not a single value, but varies with frame size and enclosure, this is really a "matrix" of factors.

The overall per unit rise factor matrix is then converted into a set of multiplying factors (to customize the HP values in the reference database), through the following equations.

Intermediate calculations

TEBC Motors m=0.849 for Modification Item (Base Speed)less than or equal to 1800 m=0.849+0.000030619×(Base Speed −1800) for Base Speed greater than 1800 b=(1−m)

DPFV Motors m=0.668 for Modification Item (Base Speed) less than or equal to 1800 m=0.668+0.00004131×(Base Speed −1800) for Base Speed greater than 1800 b=(1−m)

Using the values of m and b calculated above, the per unit rise factor is used to compute a matrix of multiplying factors which is used to customize reference database B.

multiplying factor=m×per unit rise factor+b

Each entry in reference database B of HP capability can be multiplied by the appropriate factor (by frame size, enclosure, and speed) to generate the "working table", i.e. the customized reference database for picking frame sizes.

It is to be appreciated the above calculations are specific to particular motors, and that other calculations may be needed, such other calculations being within the understanding of someone of ordinary skill of the art after reading this disclosure. However, the concepts of calculating the per unit rise factors, obtaining the overall per unit rise factors, converting these to derating factors and applying these to the basic rating data to obtain the working table, can be applied to different types of motors and for different configurations.

Following customization of reference database B, and returning attention to FIG. 3, the program enters phase 2. In this phase, step 56 determines if all of the user defined conditions are within a "normal" condition range. This normal condition range is defined as a range operating within the normal operation of a motor constructed for a selected frame/module. It is a goal of phase 2 to select a smallest (most economical) motor frame/module which can be utilized within the constraints defined by the user and the application. If it is determined in step 56 the user defined conditions are all within the normal operation range, control passes to step 62. However, if any of the user defined conditions are outside of the normal operation range, the program moves to step 58, where it is determined whether any of the user defined conditions are also outside of the range of applicability for the program, i.e. no module in reference database B or the modified reference database meet all the defined conditions. If this situation occurs, then the program issues a warning suggesting modifications be made or requiring a restart of the procedure, step 60.

From step 60, the flow of the program returns to the start step 38, or one of input steps 40–48, depending upon previously input information. In either case a user is provided with an opportunity to modify the input data in steps 40–48, and steps 50–58 are repeated. When it is determined in steps 56, 58 that the user defined conditions are within a normal range, or there is a module in the access database which meets the defined conditions, the program proceeds to step 62.

In step 62, the program interpolates the basic rating information to determine HP capabilities at the actual application speed (typically not exactly equal to a speed in the reference or modified reference database). In step 64, a module meeting the above criteria is selected through a search of the reference or modified reference database B. This searching technique compares the obtained data to the data in the reference or modified reference database B. The particular implementations of such searching being known to one skilled in the art.

In the third phase of the program, step 66 determines whether the selected (smallest) module (which meets the requested rating at base speed), is able to, considering the loads requested (both continuous and momentary), meet all speeds in the application speed range defined by the user. If the answer in step 66 is yes, i.e. the selected smallest module can handle all the requested speeds/loads without any impact on variable voltage, variable frequency supply sizing, then the motor module (frame size) as well as the variable voltage, variable frequency supply, kVA and amps, are displayed on a display (step 68).

Figure 10:
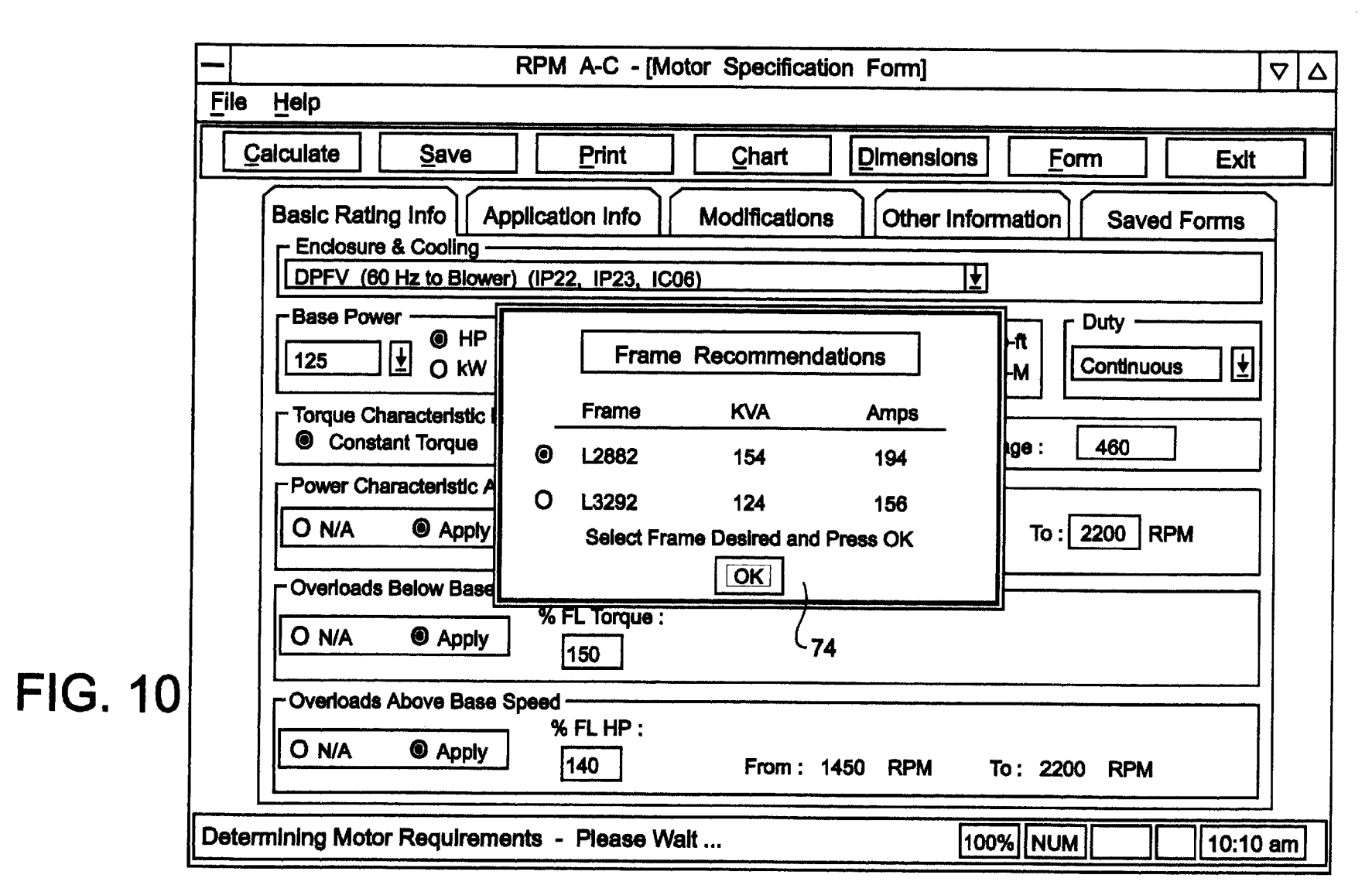

Alternatively, if in step 66 it is determined the selected module can not handle all of the requested speeds/loads without any impact on variable voltage, variable frequency supply sizing, then the program shifts to step 70 which will determine the next larger frame size, along with its associated variable voltage, variable frequency supply sizing. Step 72 then displays to the user, a choice between the smallest module and its associated variable voltage, variable frequency supply sizing and the next larger module size, along with its associated variable voltage and variable frequency supply sizing. This display being shown in FIG. 10, in area 74, Frame Recommendations.

The variable voltage and variable frequency supply kVA and the amps are computed based on known physical relationships of the variation of a motors characteristics with flux level, which is affected by the constant power speed range above base speed, the overloads above base speed, as well as the stored physical data for the variable modules.

Figure 11:
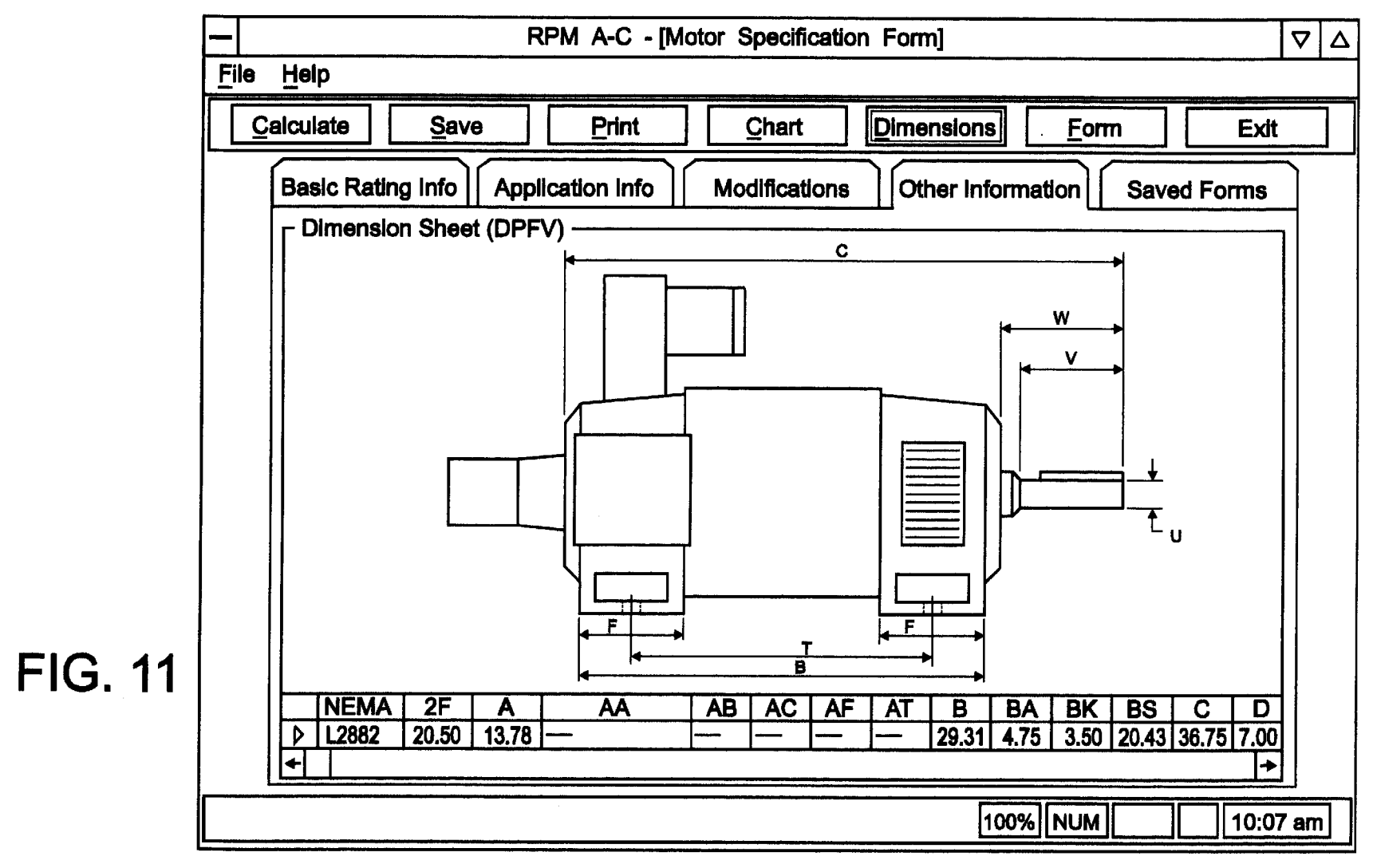
Figure 12:
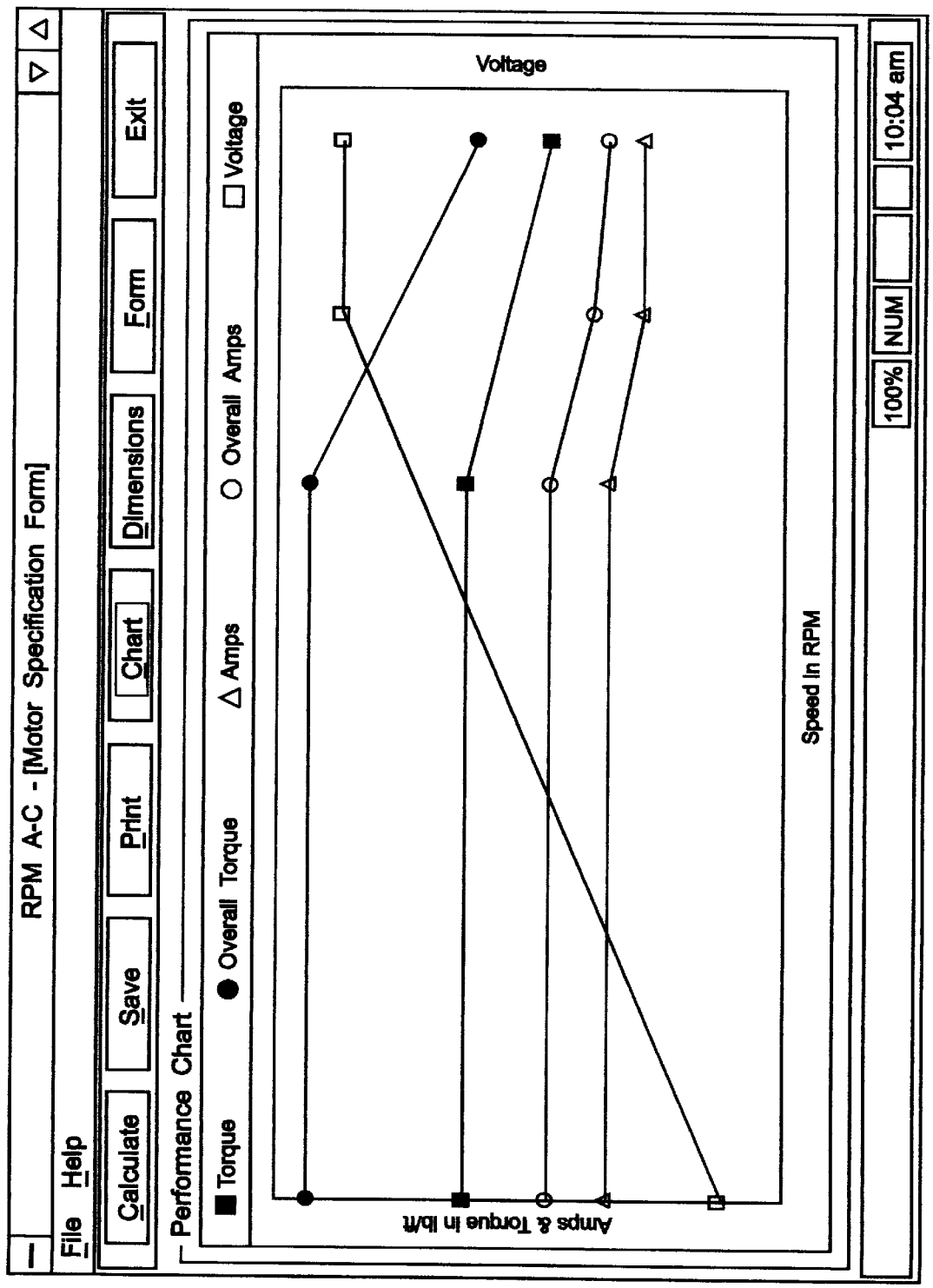
FIG. 12 is a performance chart for a selected module/frame.

Once a module size is selected, the program allows the user to display, print, and save specific information including a Dimension Sheet and Performance Chart as shown in FIGS. 11 and 12, as well as previously input information such as shown in FIGS. 5–9.

With attention to the calculation process according to the teachings of the present invention, provided below is an example of a process by which the selection of an appropriate module is obtained. It is to be appreciated the following is a simplified example of obtaining an appropriate module size, and other selections may be more complex. It is noted that the example refers to a chart to obtain certain information. While a chart is used in this example, it is to be appreciated that in the present invention the data from the chart is configured in the reference database. It is also to be appreciated that formulas similar to those used in this example are incorporated into the calculation steps of the present invention, though such formulas may vary somewhat due to the specific motor type being investigated. Obtaining of such altered formulas, for different motor types is, however, within the skill of someone knowledgeable in the motor arts.

The user defined criteria for this example include:
i) 140 HP, 2500 RPM,
ii) constant power to 5000 RPM,
iii) 150% overload below base speed,
iv) 125% overload at 5000 RPM,
v) 460 V inverter output,
vi) 60 Hz power to the DPFV blower.

Figure 13:
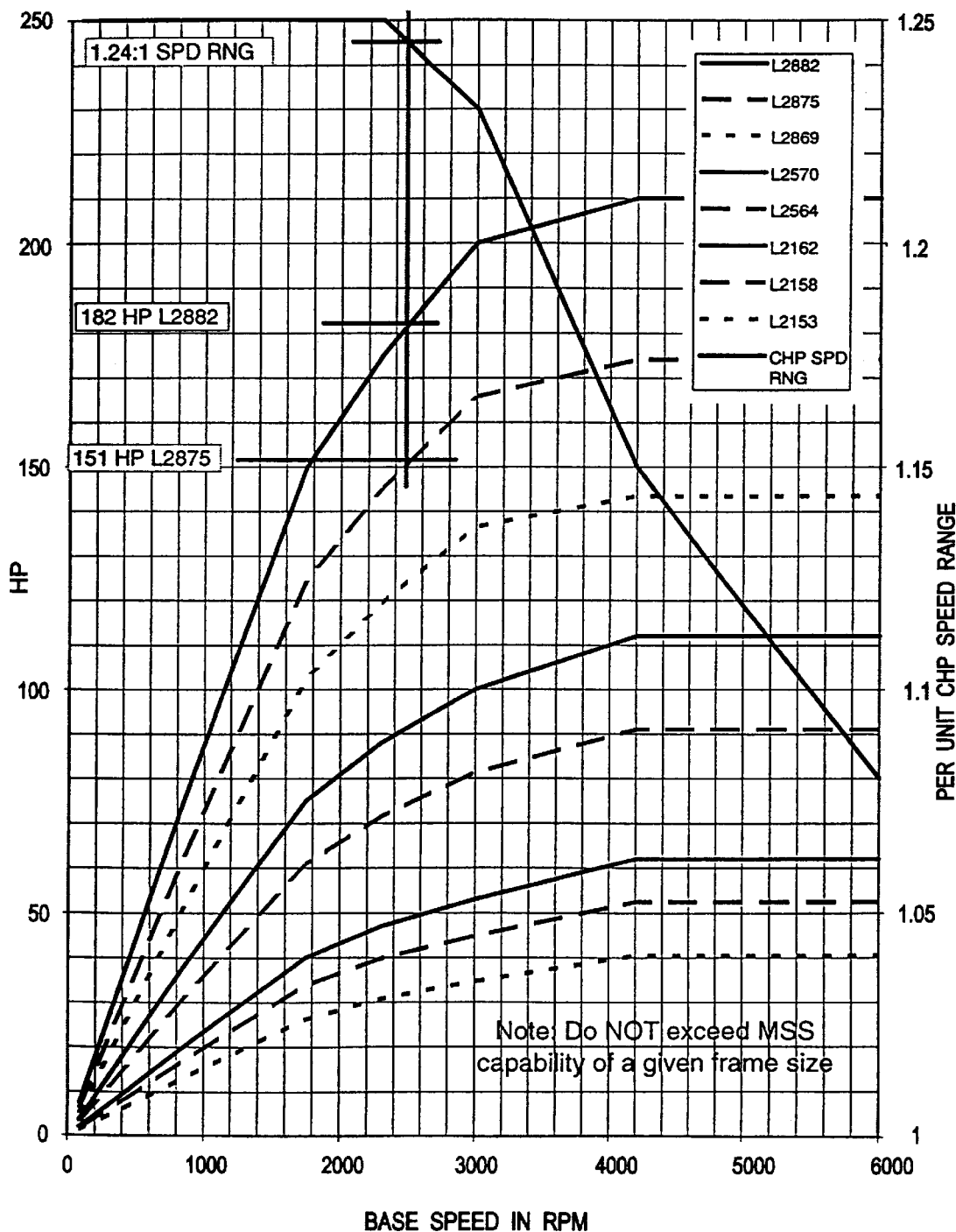
FIG. 13 is an RPM AC motor application and selection chart for a variety of frame sizes and a desired speed range ratio where the operational characteristics of the frame sizes are plotted by base speed versus horsepower.

Going into the motor capability curves, of FIG. 13, at a base speed of 2500 RPM (x-axis), the smallest frame size which has a capability exceeding 140 HP at that speed is an L2875 frame.

The L2875 shows a capability of 151 HP at 2500 RPM. At 2500 RPM base speed and full capability (151 HP for an L2875 frame), the inherent constant HP speed range is approximately 1.24:1 (reading from the CHP, constant horsepower, curve). Using the fact that this application only requires 140 HP, a constant power speed range at that rating for the L2875 frame can be calculated as:

$$CHP \text{ SPEED RANGE}_{140} = 1.24 \times \frac{151}{140} = 1.34$$

Curves of nominal kVA per HP are readily available in published form and well known to those skilled in the art. From those curves, it can bee seen that a 140 HP motor typically demands 137 kVA. That figure would have to be increased in order to satisfy the speed and overload needs.

$$kVA \text{ NEEDED} \approx kVA\,nom \times \sqrt{\frac{RPM \text{ NEEDED}}{RPM \text{ NOM}}} \times \sqrt{\frac{OL \text{ NEEDED}}{OL \text{ NOM}}}$$

For this example, $$kVA \text{ NEEDED} \approx 137 \times \sqrt{\frac{2}{1.34}} \times \sqrt{\frac{1.25}{1.10}} = 178 \text{ kVA}$$

An alternative, if 178 kVA was an unacceptable increase in the inverter size, might be to use the next larger motor frame (L2882). From the capability curves it can be seen that the L2882 frame can deliver 182 HP at 2500 RPM, or 30% more than the application requires, and with an approximate inherent constant HP speed range of 1.24:1 (reading from the CHP curve). This frame size would then be capable of a constant power speed range (at 140 HP) of:

$$CHP \text{ SPEED RANGE}_{140} = 1.24 \times \frac{182}{140} = 1.61$$

This would then still fall shy of the 2:1 speed range desired, but would reduce the kVA requirement as shown below, $$kVA \text{ NEEDED} \approx 137 \times \sqrt{\frac{2}{1.61}} \sqrt{\frac{1.25}{1.10}} = 163 \text{ kVA}$$

In conclusion, either an L2875 frame with a 178 kVA inverter, or an L2882 frame motor with an inverter rated at 163 kVA (continuous) could be utilized for this application.

The invention has been described with reference to the preferred embodiment. It is to be appreciated that the above described functions and means may be performed by an appropriately programmed computer or processor, by dedicated modules, or by a combination thereof. Obvious, modifications and alterations will occur to others upon reading and understanding the preceding detailed description of the preferred embodiment. It is intended that the invention be construed as including all such alternations and modifications insofar as they come within the scope of the appended claims or the equivalents thereof.

Having thus described the preferred embodiment, the invention is now claimed to be:

1. A method of automatically selecting a motor frame size, the method comprising the steps of:

storing a reference database in a data storage, the reference database including motor data characteristics for a plurality of predefined motor frame sizes;

inputting user defined operating condition information for a desired motor type;

determining whether the input user defined operating condition information require a modification of the reference database;

when the operating condition information requires modification of the reference database, generating a modified reference database by modifying the reference database based on the input user defined operating condition information;

comparing the input user defined operating condition information and a one of the reference database and the modified reference database;

determining from the comparing step whether the user defined operating condition information are within a normal working range of any of said predefined motor frame sizes within said one of the reference database and the modified reference database;

searching said one of the reference database and the modified reference database for a smallest motor frame size which meets the requirements of the input user defined operating condition information, when the user defined operating condition information are within said normal working range of at least one motor frame size within said one of the reference database and the modified reference database;

selecting the smallest motor frame size; and, displaying the selected smallest motor frame size.

2. The method according to claim 1 further including the steps of:

determining from the comparing step whether at least one of the user defined operating condition information are outside of the applicability of said plurality of predefined motor frame sizes within said one of the reference database and the modified reference database;

generating a warning when it is determined that at least one of the user defined operating condition information are outside the applicability of the plurality of predefined motor frame sizes in said one of the reference database and the modified reference database;

displaying the warning to the user, the warning suggesting inputting modified user defined operating condition information; and, inputting modified user defined operating condition information.

3. The method according to claim 1 wherein the step of determining whether the input user defined operating condition information require modification of the reference database further includes the steps of:

interpreting values input for: (i) type of enclosure and cooling method, (ii) altitude at which motor is intended to operate (iii) ambient temperature at which motor is intended to operate, and (iv) acceptable temperature rise on a power inverter associated with a desired motor;

computing individual per unit rise factor for each of said values (i–iv);

multiplying each of said individual per unit rise factors to obtain an overall per unit rise factor;

converting the overall per unit rise factor to a set of derating factors associated with a set of horsepower values in the reference database; and, multiplying each of the horsepower values in the reference database by a derating factor in the set of derating factors to obtain said modified reference database, wherein the modified reference database is adapted for use in further calculations and frame size selection.

4. The method according to claim 1 further including the steps of:

selecting a next larger frame size when at least one of the user defined operating condition information are outside of a normal range;

displaying the selected frame size and the next larger frame size; and, providing the user with an option of choosing either the selected frame size or the next larger frame size.

5. The method according to claim 1 further including the steps of:

testing the smallest selected frame size to determine whether the smallest selected frame size is usable for a range of speed requirements;

selecting a next larger frame size when the smallest selected frame size is not suitable for the range of speed requirements;

displaying the selected frame size and the next larger frame size; and, providing the user with an option of choosing either the selected frame size or the next larger frame size.

6. The method according to claim 1 further including displaying recommended operating values along with the selected smallest motor frame size.

7. The method according to claim 1 wherein the step of inputting said user defined operating condition information incudes inputting a base power value, a base speed value, and an enclosure type.

8. The method according to claim 1 wherein the step of inputting said user defined operating condition information includes inputting information relating to an enclosure type and manner of cooling the enclosure, altitude at which the motor is to operate, ambient temperature at which the motor is to operate and a temperature rise which will occur on an inverter power.

9. A motor selection method comprising the steps of:

storing data corresponding to a plurality of motor frame sizes in a reference database, the data in the reference database representing operating capabilities associated with each of the plurality of motor frame sizes;

inputting motor application data representing operating characteristics for a desired motor;

generating a working database from the data stored in the reference database based on the application data input during the inputting step;

searching the working database for motor frame sizes having associated operating capabilities which meet the operating characteristics of the application data;

determining a smallest frame size having the associated operating capabilities which meet the operating characteristics of the application data;

selecting the smallest frame size determined to meet the operating characteristics of the application data; and, displaying the selected smallest frame size.

10. The method according to claim 9 wherein the determining step further includes, testing whether the selected smallest frame size meets the operating characteristics over a predetermined range of motor operation;

selecting a next largest frame size when the selected smallest frame sizes fails to meet the operating characteristics over the predetermined range; and, displaying the selected next largest frame size together with the selected smallest frame size.

11. The method according to claim 9 wherein the step of inputting said motor application data includes inputting motor application data representing environmental characteristics in which the motor will operate.

12. The method according to claim 11 wherein:

the step of inputting said motor application data includes inputting motor application modification items representing information including enclosure type and manner of cooling the enclosure, altitude at which the motor is to operate, ambient temperature at which the motor is to operate, and a temperature rise which will occur on inverter power; and the step of generating the working database includes generating the working database based on the motor application modification items.

13. The method according to claim 12 wherein the step of generating the working database includes the steps of:

calculating a multiplying factor, using information associated with the motor application modification items; and, customizing the data stored in the storing step by the multiplying factor to obtain the working database.

14. The method according to claim 10 further including, following displaying of the next largest and smallest frame sizes, the steps of:

selecting, by a user, a one of the smallest frame size and the next largest frame size;

displaying a dimension sheet, in an electronic format, representing a physical construction of the selected one of the smallest frame size and the next larger frame size; and, displaying a performance chart representing performance characteristics of a motor of the selected one of the smallest frame size and the next larger frame size.

15. An apparatus implemented on a computer for automatically selecting a motor frame size, the apparatus comprising:

means for storing a reference database in a data storage, the reference database including motor data characteristics for a plurality of predefined motor frame sizes;

means for inputting user defined motor application data for a desired motor type;

means for determining whether the input user defined motor application data require a modification of the reference database;

means for modifying the reference database based on the input user defined motor application data, when it is determined a modification of the reference database is required;

means for comparing the input user defined motor application data and a one of the reference database and the modified reference database;

means for determining from the comparing step whether the user defined motor application data are within a normal working range of any of said predefined motor frame sizes within said one of the reference database and the modified reference database;

means for searching said one of the reference database and the modified reference database for a smallest motor frame size which meets the requirements of the input user defined motor application data, when the user defined motor application data are within said normal working range of at least one motor frame size within said one of the reference database and the modified reference database;

means for selecting the smallest motor frame size; and, means for displaying the selected smallest motor frame size.

16. The apparatus according to claim 15 further including:

means for determining from the comparing step whether at least one of the user defined motor application data are outside of the applicability of said plurality of predefined motor frame sizes within said one of the reference database and the modified reference database;

means for generating a warning when it is determined that at least one of the user defined motor application data are outside the applicability of the plurality of predefined motor frame sizes in said one of the reference database and the modified reference database;

means for displaying the warning to the user, the warning suggesting inputting modified user defined motor application data; and, means for inputting modified user defined motor application data.

17. The apparatus according to claim 15 wherein the means of determining whether the input user defined motor application data require modification of the reference database further includes:

means for receiving values input for: (i) type of enclosure and cooling method, (ii) altitude at which the motor is to operate and (iii) ambient temperature at which the motor is to operate, and (iv) acceptable temperature rise on a power inverter associated with a desired motor;

means for computing individual per unit rise factor for each of said values (i–iv);

means for multiplying each of said individual per unit rise factors to obtain an overall per unit rise factor;

means for converting the overall per unit rise factor to a set of derating factors associated with a set of horsepower values in the reference database; and, means for multiplying each of the horsepower values in the reference database by a derating factor in the set of derating factors to obtain said modified reference database, wherein the modified reference database is adapted for use in further calculations and frame size selection.

18. The apparatus according to claim 15 further including:

means for selecting a next larger frame size when at least one of the user defined motor application data are outside of a normal range;

means for displaying the selected frame size and the next larger frame size; and, means for providing the user with an option of choosing either the selected frame size or the next larger frame size.

19. The apparatus according to claim 15 further including:

means for testing the smallest selected frame size to determine whether the smallest selected frame size is usable for a range of speed requirements;

means for selecting a next larger frame size when the smallest selected frame size is not suitable for the range of speed requirements;

means for displaying the selected frame size and the next larger frame size; and means for providing the user with an option of choosing either the selected frame size or the next larger frame size.

* * * * *